(12) United States Patent
Mauro et al.

(10) Patent No.: US 9,284,218 B1
(45) Date of Patent: Mar. 15, 2016

(54) METHODS FOR CHEMICALLY STRENGTHENING GLASS ARTICLES

(71) Applicant: Corning Incorporated, Corning, NY (US)

(72) Inventors: John Christopher Mauro, Corning, NY (US); Charlene Marie Smith, Corning, NY (US); Donghui Zhao, Tonawanda, NY (US)

(73) Assignee: CORNING INCORPORATED, Corning, NY (US)

( * ) Notice: Subject to any disclaimer, the term of this patent is extended or adjusted under 35 U.S.C. 154(b) by 257 days.

(21) Appl. No.: 13/923,837

(22) Filed: Jun. 21, 2013

Related U.S. Application Data

(60) Provisional application No. 61/666,341, filed on Jun. 29, 2012.

(51) Int. Cl.
| | | |
|---|---|---|
| C03C 21/00 | (2006.01) | |
| G06F 19/00 | (2011.01) | |
| G06F 17/50 | (2006.01) | |

(52) U.S. Cl.
CPC .......... *C03C 21/002* (2013.01); *G06F 17/5009* (2013.01)

(58) Field of Classification Search
CPC .............. G06F 19/701; G06F 2217/10; G06F 17/5009; G06F 17/10; Y10T 428/315; C03C 21/002; C03C 3/085; C03C 21/00; C03C 23/00
See application file for complete search history.

(56) References Cited

U.S. PATENT DOCUMENTS

| | | | | |
|---|---|---|---|---|
| 6,472,068 | B1 | 10/2002 | Glass et al. | 428/410 |
| 6,516,634 | B1 * | 2/2003 | Green | C03C 21/00 65/114 |
| 8,415,013 | B2 * | 4/2013 | Barefoot | C03C 3/064 428/220 |
| 8,873,028 | B2 * | 10/2014 | Sheldon | C03C 21/002 356/35.5 |
| 2002/0148978 | A1 * | 10/2002 | Innes | B82Y 10/00 250/492.22 |
| 2005/0084679 | A1 * | 4/2005 | Sglavo | C03C 21/002 428/410 |
| 2006/0176479 | A1 * | 8/2006 | Laurence | G01J 1/42 356/317 |
| 2010/0009154 | A1 * | 1/2010 | Allan | C03C 3/085 428/220 |
| 2010/0028607 | A1 | 2/2010 | Lee et al. | 428/156 |
| 2010/0243431 | A1 * | 9/2010 | Kuboi | G01N 23/00 204/192.33 |
| 2011/0045961 | A1 | 2/2011 | Dejneka et al. | 501/66 |

(Continued)

OTHER PUBLICATIONS

Murch, Graeme E. "Diffusion in Crystalline Solids" Materials Science series. published by American Press, Inc copyright 1984 pp. 381-382,385,387,389-390.*

(Continued)

*Primary Examiner* — Jodi C Franklin
(74) *Attorney, Agent, or Firm* — Timothy M. Schaeberle

(57) ABSTRACT

Methods for chemically strengthening glass articles, e.g., glass sheets, are disclosed, in which computer-implemented techniques are employed to select the conditions, e.g., times, temperatures, and bath compositions and sizes, used in the chemical strengthening. The computer-implemented techniques can be applied to chemical-strengthening methods that employ more than one ion-diffusion treatment, e.g., more than one ion-exchange treatment or a combination of at least one ion-exchange treatment and at least one heat treatment. Through the use of the computer-implemented techniques, more precisely-controlled ion concentration profiles can be achieved in chemically-strengthened glass articles, which can improve the ultimate mechanical properties of the articles.

11 Claims, 10 Drawing Sheets

(56) References Cited

U.S. PATENT DOCUMENTS

2011/0085279 A1* 4/2011 Lanagan ............... H01G 4/105
  361/321.1
2012/0194974 A1 8/2012 Weber et al. ............. 361/679.01

OTHER PUBLICATIONS

"Dynamic Monte Carlo method" in *Wikipedia, The Free Encyclopedia*. Retrieved May 24, 2012 from http://en.wikipedia.org/wiki/Dynamic_Monte_Carlo_method.

D J Green, R Tandon, V M Sglavo, Crack arrest and multiple cracking in glass through the use of designed residual stress profiles, Science, 283, 1295 (1999).

V M Sglavo, L Larentis, D J Green, Flaw-insensitive ion-exchanged glass: I, theorectical aspects, J. Am. Ceram. Soc., 84, 1827 (2001).

V. M. Sglavo and D. J. Green, Flaw Insensitive Ion-Exchanged Glass: II, Production and Mechanical Performance, J. Am. Ceram. Soc., 84, 1832-38 (2001).

Green et al; "An introduction to the mechanical properties of ceramics", pp. 224-230, Cambridge University Press, 1998.

Sglavo et al; "In situ observation of crack propagation in ESP (engineered stress profile) glass", Eng. Frac. Mech., 74, 1383 (2007).

\* cited by examiner

METHODS FOR CHEMICALLY STRENGTHENING GLASS ARTICLES

CROSS-REFERENCE TO RELATED APPLICATIONS

This application claims the benefit of priority under 35 U.S.C. §119 of U.S. Provisional Application Ser. No. 61/666,341 filed on Jun. 29, 2012 the content of which is relied upon and incorporated herein by reference in its entirety.

FIELD

This disclosure relates to methods for chemically strengthening glass articles, e.g., glass sheets, and, in particular, to computer-implemented techniques for selecting the conditions used in such chemical strengthening. In certain embodiments, the computer-implemented techniques are applied to chemical-strengthening methods that employ more than one ion-diffusion treatment, e.g., more than one ion-exchange treatment or a combination of at least one ion-exchange treatment and at least one heat treatment.

DEFINITIONS

The term "glasses" (as well as its singular form, "glass") includes both glasses and glass-ceramics.

The term "glass article" (as well as its plural form, "glass articles") is used in its broadest sense to include any object made wholly or partly of glass and/or a glass-ceramic.

The phrase "ion-diffusion treatment" includes both (i) an ion-exchange treatment in which a glass article is immersed in a molten salt bath, and (ii) a heat treatment in which the glass article is heated without being in a salt bath. In both cases, ion diffusion occurs within the glass article; for the ion-exchange treatment, ions also enter and leave the glass article through the interface between the article and the salt bath.

BACKGROUND

Chemically-strengthened glass articles, also known as ion-strengthened glass articles, are used in a variety of applications. For example, chemically-strengthened glasses are widely used as touch screens for hand-held consumer electronics such as smart phones and tablets.

In broad overview, chemically-strengthened glass articles are made by forming a glass having a composition suitable for chemical strengthening into a desired configuration, e.g., into a glass sheet in the case of faceplates, and then subjecting the formed glass to chemical strengthening through an ion-exchange (IOX) process, e.g., a treatment in which the formed glass is submersed in a salt bath at an elevated temperature for a predetermined period of time.

The IOX process causes ions from the salt bath, e.g., potassium ions, to diffuse into the glass while ions from the glass, e.g., sodium ions, diffuse out of the glass. Because of their different ionic radii, this exchange of ions between the glass and the salt bath results in the formation of a compressive layer at the surface of the glass which enhances the glass's mechanical properties, e.g., its surface hardness. The effects of the ion exchange process are typically characterized in terms of two parameters: (1) the depth of layer (DOL) produced by the process and (2) the final maximum surface compressive stress (CS). Values for these parameters are most conveniently determined using optical measurements, and commercial equipment is available for this purpose.

For most applications of chemically-strengthened glass articles and, in particular, for consumer applications, articles with a high fracture strength, a high resistance to contact damage, and a high surface flaw tolerance are desired. A high fracture strength means that the article can withstand substantial levels of mechanical impact without fracturing. A high resistance to contact damage and a high surface flaw tolerance mean that the article can withstand substantial levels of surface damage without a catastrophic failure.

These latter surface properties are particularly desirable because, in practice, the presence of surface defects, such as flaws and cracks, has been found to be one of the major causes for glass failure. Consequently, the robustness of a chemically-strengthened glass article in the hands of a consumer turns out to be dependent on the handling and processing conditions the article experienced during manufacture. To reduce the costs associated with "gentle" manufacturing, glass articles that are resistant to surface damage and are tolerant of surface flaws are thus desired since such resistance and tolerance reduces the effects of surface conditions on the ultimate strength of the article.

Developing chemical strengthening protocols that achieve a high fracture strength, a high resistance to contact damage, and a high tolerance to surface flaws has proved challenging. Indeed, conventional one-step ion-exchange (IOX) processes do not always improve glass strength reliability. Instead, as reported by K. Matsuno, K. Shukuri, T. Nakazumi, K. Matsumoto, and K. Sono, paper 25-G-87F presented at the Glass Division of the American Ceramic Society, Fall Meeting, Bedford Springs, Pa., 30 Sep. to 2 Oct. 1987, strength variation can increase after ion exchange in silicate glass. Some studies have appeared in the literature regarding the use of double ion exchange (DIOX) processes to improve glass properties. See D. J. Green, R. Tandon, and V. M. Sglavo, Crack arrest and multiple cracking in glass through the use of designed residual stress profiles, Science, 283, 1295 (1999); and V. M. Sglavo, A. Prezzi, and D. J. Green, In situ observation of crack propagation in ESP (engineered stress profile) glass, Eng. Frac. Mech., 74, 1383 (2007). However, these studies have had a limited scope and have not provided generally-applicable methods for obtaining quantitative information for the complex ion diffusion kinetics that result when multiple ion-diffusion treatments are applied to a glass article in order to improve its ultimate properties.

Analytic solutions to the diffusion equations are available for only a limited set of geometries and limited sets of boundary and initial conditions. See, for example, Crank, J. *The Mathematics of Diffusion* (2nd ed.), Oxford: Oxford University Press, 1975. Ion-diffusion treatments which may be desirable for chemically-strengthening glass articles generally have complex boundary and initial conditions and are not mathematically solvable in closed form. Also, the programming effort needed to handle the wide range of boundary and initial conditions that can be envisioned is daunting. Indeed, the complexity, cost, and time commitments associated with such an effort can rival those associated with the historical brute-force approach of performing multiple ion-diffusion treatments and then measuring the resulting concentration profiles.

The art has thus been faced with a lack of a practical methodology for dealing with the complex compositional profiles and ion kinetics that result from ion-diffusion treatments. Without quantitative information regarding the ion diffusion kinetics associated with chemical-strengthening, glass engineers have been working under a significant handicap when designing chemical-strengthening protocols.

The present disclosure addresses this existing problem in the art and provides computer-implemented techniques for calculating concentration profiles and diffusion kinetics of ions in glass articles during ion-diffusion treatments and, in particular, during multiple, sequential, ion-diffusion treatments. As shown by the examples set forth below, the techniques require only limited user input, employ efficient numerical calculations, and can handle the wide variety of ion-diffusion conditions that glass engineers may envision for improving the properties of chemically-strengthened glass articles.

SUMMARY

In accordance with a first aspect, a method is disclosed for chemically strengthening a glass article (e.g., a glass plate) which contains at least one mobile ion (e.g., $Na^+$ and $K^+$), the method including subjecting the glass article to one or more ion-diffusion processes (e.g., multiple ion-exchange processes or at least one ion-exchange process and at least one heat treatment) in each of which the glass article is subject to a predetermined temperature versus time profile (e.g., a profile in which the glass article is held at a predetermined temperature for a predetermined period of time), wherein at least one profile is at least partially based on (e.g., selected using) a computer-implemented model for the spatial distribution as a function of time of the at least one mobile ion within the glass article, the computer-implemented model including moving mobile ions within the glass article based on a random value.

In accordance with a second aspect, a computer-implemented method is disclosed for predicting/estimating the spatial distribution as a function of time of at least one mobile ion (e.g., $Na^+$ and $K^+$) within a glass article (e.g., a glass plate) undergoing an ion-diffusion process (e.g., an ion-exchange process or a heat treatment) in which the glass article is subject to a temperature versus time profile (e.g., a profile in which the glass article is held at a predetermined temperature for a predetermined period of time), the method including moving the at least one mobile ion within the glass article based on a random value.

In accordance with a third aspect, a computer-implemented method is disclosed for predicting/estimating the spatial distribution as a function of time of at least one mobile ion (e.g., $Na^+$ and $K^+$) within a glass article (e.g., a glass plate) undergoing an ion-diffusion process (e.g., an ion-exchange process or a heat treatment) in which the glass article is subject to a temperature versus time profile (e.g., a profile in which the glass article is held at a predetermined temperature for a predetermined period of time), the method including using three or less modeling parameters (e.g., $v_0$ and E, $v_0$, E, and a scaling factor, or $v_0$, $E_{glass}$, and $E_{inter}$; see below) to model movement of the at least one mobile ion during the ion-diffusion process, the values for the three or less modeling parameters being determined by fitting to experimental data for the glass making up the glass article.

Apparatus for practicing the above methods, specifically, programmed computers and computer readable storage media, is also disclosed.

The above summaries are only for the convenience of the reader and are not intended to and should not be interpreted as limiting the scope of the disclosure. More generally, it is to be understood that both the foregoing general description and the following detailed description are merely exemplary and are intended to provide an overview or framework for understanding the nature and character of the claimed subject matter.

Additional features and advantages are set forth in the detailed description which follows, and in part will be readily apparent to those skilled in the art from that description or recognized by practicing the claimed subject matter as exemplified by the description herein. The accompanying drawings are included to provide a further understanding, and are incorporated in and constitute a part of this specification. It is to be understood that the various features disclosed in this specification and in the drawings can be used in any and all combinations.

BRIEF DESCRIPTION OF THE DRAWINGS

FIGS. 7-10 used the same ion-exchange protocol.

DETAILED DESCRIPTION

Figure 1:
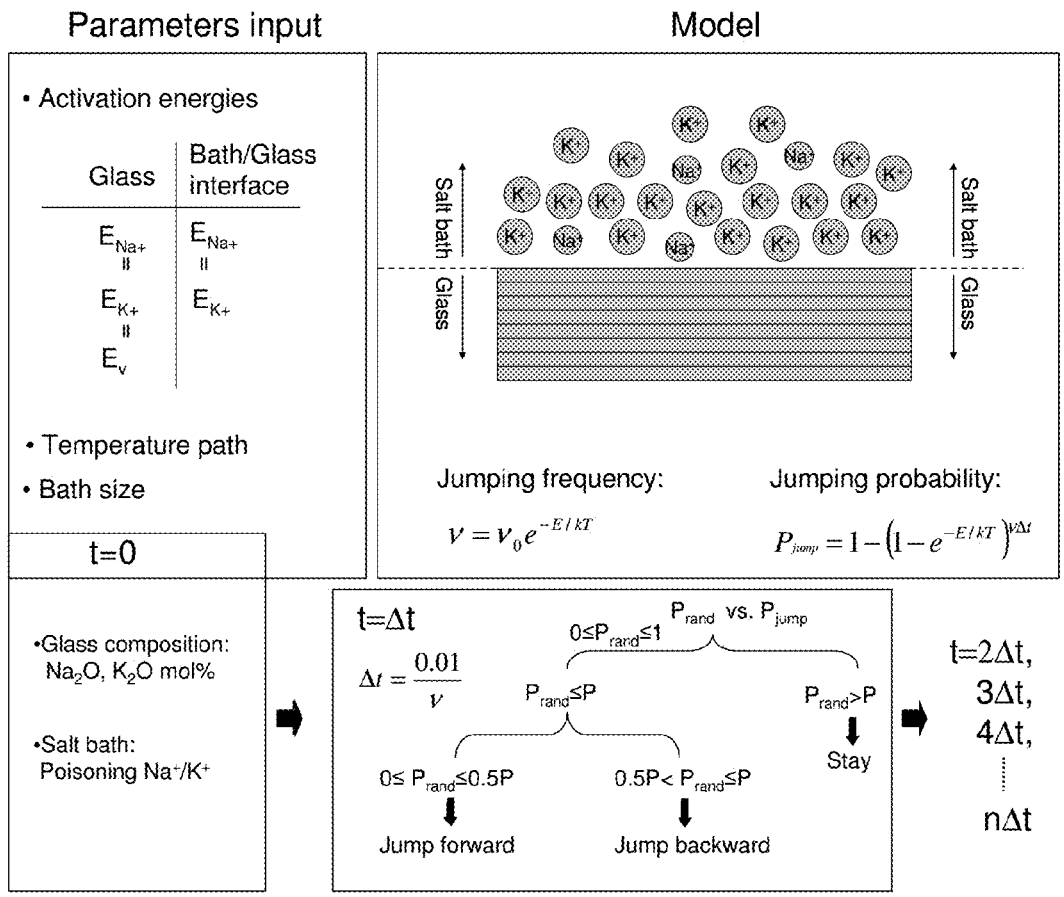
FIG. 1 is a representative flow chart illustrating an embodiment of the disclosure.

In outline, the computer-based techniques disclosed herein employ a lattice jumping (lattice hopping) model to calculate time-dependent ion concentration profiles produced by an ion-diffusion process. In the case of glass articles in the form of thin plates, e.g., a glass sheet, a one-dimensional analysis is used with the ion diffusion direction being normal to the major surfaces of the plates. A series of layers arranged in the ion diffusion direction is then used to model the glass article with jumping (hopping) taking place between the layers. (Note that a series of layers could also be used to model the salt bath used in an ion-exchange process, but as discussed below, the analysis can be simplified by employing an interface analysis to represent the bath.)

For glass articles having shapes more complex than a thin plate, a two-dimensional or three-dimensional analysis may be needed where the layers become two-dimensional areas or three-dimensional volumes, with jumping taking place between adjacent areas or volumes, instead of between adjacent layers as in the one-dimensional case. For ease of presentation, the following discussion will be in terms of the one-dimensional case, it being understood that the techniques disclosed herein are equally applicable to higher dimensional problems.

Each layer includes a number of sites, which can be occupied either by the most mobile species in the system, such as alkali ions (e.g. $Na^+$ and/or $K^+$), or by vacancies. In a representative embodiment, a user inputs the thickness L of the glass article or the portion thereof which is to be analyzed, the thickness d of a layer (e.g., 1 micron), and the number of sites $N_s$ per layer (e.g., 100 sites). Alternatively, fixed values can be used for one or more of these parameters. In either case, the number of layers is equal to L/d. For many problems, the number of layers will be on the order of 200.

As used herein, the thickness L of the glass article is referred to as a "system" parameter (other system parameters include the size of the bath, the initial composition of the bath, the initial composition of the glass article, the temperature of the ion diffusion process, and the duration of the ion-diffusion process), while the thickness d of a layer and the number of sites $N_s$ per layer are referred to as "discretization" parameters (another discretization parameter is the time step $\Delta t$ discussed below). In addition to system and discretization parameters, as discussed below, the techniques disclosed herein also use "modeling" parameters (e.g., jumping parameters for the mobile ion species).

Initial conditions, including initial boundary conditions, are also needed and can be either fixed in the software used to implement the technique or specified by the user when an analysis is performed. As an illustrative example, consider the case of a glass article that has not yet been subjected to any ion-diffusion process. Based on its as-made composition, such a glass article will have base concentrations for one or more mobile species. For example, the glass article might have a Na:K ion ratio of 9:1. In such a case, the initial conditions for layers having 100 sites located within the glass article could, for example, be 90 sites containing $Na^+$ ions and 10 sites containing $K^+$ ions.

As to boundary conditions, to avoid the need to represent the entire thickness of a glass article, the thickness L used in the analysis can be chosen based on an estimate of the depth within the glass article at which the base composition will be substantially unchanged. For example, such an estimate can be made using an analytic solution to the diffusion equation and values for the time and temperature of the ion-diffusion process, as well as the interdiffusion coefficient for the mobile ions undergoing diffusion. By making L larger than this estimated depth, e.g., 10 percent larger, the boundary condition within the body of the glass article can be simply a fixed number of mobile ions within the deepest layer, i.e., the occupancy of sites within the deepest layer will simply be held constant as the analysis proceeds.

The boundary condition at the interface of the glass article with its environment will depend on the type of ion-diffusion process which is to be performed. For the case of an ion-exchange (IOX) process, the boundary condition will be expressed as jumping parameters and ion concentrations for the layer in contact with the molten salt bath (the "edge" or "interface" layer). In general, the jumping parameters for the interface layer will be different from the jumping parameters used for layers which are not in contact with the molten salt bath (the "non-edge" layers). However, as discussed below, in connection with the embodiments that employ a reduced number of modeling parameters, the jumping parameters for the edge and non-edge layers may be the same. For the case of an ion-diffusion process that is a heat treatment, the boundary condition at the interface of the glass article with its environment will specify that ions cannot leave the article. This can be done by, for example, specifying that ions in an edge layer can move inward but not outward, e.g., by specifying that ions in an edge layer can only jump towards the edge layer's neighboring non-edge layer.

It should be noted that if the glass article is sufficiently thin and/or the ion-diffusion process is conducted for an extensive period of time and/or at an especially high temperature, L may be the actual thickness of the glass article, in which case, edge layers will be used at both interfaces between the glass article and its environment, i.e., a deepest layer whose sites are occupied by fixed numbers of mobile species will not be used.

It should also be noted that the initial conditions for a glass article that has already undergone an ion-diffusion process are the conditions that existed at the end of the last process, with the new ion-exchange process being represented by new environmental conditions for the edge layer(s). In certain embodiments, the techniques disclosed herein take into account changes in the composition of the molten salt bath as a result of ion-exchange with a glass article. This effect is known as "bath poisoning" and, in the case of Na/K exchange, is often reported as the ratio of the sodium molar concentration in the bath to the sum of the sodium and potassium molar concentrations, i.e. [Na]/([Na]+[K]). As discussed below, the bath poisoning effect can be taken into account through changes in the ion concentrations for the edge layer(s). For such an embodiment, one could formally consider each change in the bath composition as a separate ion-diffusion process, but since in practice, bath poisoning is not so considered, it will be treated as part of an overall ion-exchange process herein.

Once the geometry of the system and the initial and boundary conditions have been specified, the analysis proceeds by the mobile species performing a random walk among different layers or within the same layer with a certain jumping frequency, energy barrier, and jumping probability. The jumping probability $P_{jump-i}$ for mobile species "" can be expressed using an equation of the form:

$$P_{jump-i} = 1 - (1 - e^{-E_i/kT})^{v_i \Delta t} \quad \text{Eq. (1)}$$

where k is Boltzmann's constant, T is temperature, $\Delta t$ is the time step used in the analysis, $E_i$ is the jumping energy barrier for the $i^{th}$ species (a modeling parameter), and $v_i$ is the $i^{th}$ specie's jumping frequency given by an equation of the form:

$$v_i = v_{i-pre} e^{-E_i/kT} \quad \text{Eq. (2)}$$

where $v_{i-pre}$ is a pre-factor (a modeling parameter).

As can be seen, Eqs. (1) and (2) include two modeling parameters for each mobile species, i.e., $E_i$ and $v_{i-pre}$. Furthermore, since the mobile species can be in the glass or in the salt bath, the number of modeling parameters is doubled. In addition, the vacancies in the glass and the bath also can be assigned jumping frequencies and jumping energy barriers. Accordingly, for the representative case of an ion-exchange process involving Na⁺ and K⁺ ions, there are twelve potential modeling parameters, i.e., twelve modeling parameters whose values need to be obtained by estimation and/or by fitting to experimental data, i.e., $E_{Na\text{-}bath}$, $v_{Na\text{-}bath\text{-}pre}$, $E_{K\text{-}bath}$, $v_{K\text{-}bath\text{-}pre}$, $E_{vac\text{-}bath}$, and $v_{vac\text{-}bath\text{-}pre}$ for the molten salt bath and $E_{Na\text{-}glass}$, $v_{Na\text{-}glass\text{-}pre}$, $E_{K\text{-}glass}$, $v_{K\text{-}glass\text{-}pre}$, $E_{vac\text{-}glass}$, and $v_{vac\text{-}glass\text{-}pre}$ for the glass. The fitting can, for example, be based on comparing one or more calculated concentration profiles to measured concentration profiles obtained by, for example, SEM-EDX microanalysis. For example, in the case of energy barriers, a diffusivity value D can be obtained from experimental data and then transformed into an energy barrier E using the equation $D=D_0\exp(-E/kT)$. A representative value for the energy barriers of ions undergoing an ion-diffusion process is on the order of 1.9 electronvolts, the exact value depending on the composition of the glass making up the glass article.

In accordance with certain embodiments, it has been found that the number of modeling parameters can be significantly reduced while still achieving accurate predictions/estimates of ion concentration profiles and ion kinetics in glass articles undergoing ion-diffusion processes. Indeed, in some embodiments, the total number of modeling parameters that need to be estimated and/or fitted to experimental data can be as few as two or three parameters (see below). This reduction in modeling parameters significantly reduces the complexity of the analysis and, in particular, the process of estimating and/or fitting modeling parameters to experimental data. It thus constitutes an important benefit of the present disclosure.

As a first step in the reduction in the number of modeling parameters, the jumping frequency prefactors (i.e., the $v_{i\text{-}pre}$'s) are assumed to be the same for all the ions and the vacancies. The jumping frequencies then vary only based on the energy barriers, i.e., Eq. (2) becomes:

$$v_i = v_0 e^{-E_i/kT} \qquad \text{Eq. (3)}$$

where $v_0$ is the common pre-factor. A representative value for $v_0$ is on the order of $10^{12}$ sec⁻¹.

Next, the bath is not treated explicitly, but implicitly, through the use of edge layer parameters (also referred to herein as "interface parameters"). For example, for the representative case of an ion-exchange process involving Na⁺ and K⁺ ions, and assuming that the jumping frequency pre-factor $v_0$ is used for the edge layer, the interface modeling parameters can be $E_{Na\text{-}inter}$, $E_{K\text{-}inter}$, and $E_{vac\text{-}inter}$. In this way, layers only need to be created within the glass article and not in the bath, which substantially reduces computation time and complexity. The composition of the bath comes into play through the numbers of interface sites occupied by specific mobile species.

For example, for a molten salt bath containing a specified ratio of K⁺ to Na⁺ ions and assuming (i) the bath is well-mixed, e.g., through convective mixing, and (ii) the volume of the bath is sufficiently large so that the concentrations of K⁺ and Na⁺ ions in the bath do not change substantially during the course of the ion-exchange process, the interface sites will have constant K⁺ and Na⁺ contents equal to those in the bath. For example, if the bath only contains K⁺ ions, then all of the interface sites will contain K⁺ ions.

As noted above, as an ion-exchange process continues, the composition of the bath used in the process can change if, for example, the bath has a relatively small size compared to the number of glass articles undergoing ion exchange. This phenomenon, known as "bath poisoning," can be readily handled by the techniques disclosed herein by calculating the numbers of mobile species that have moved into and out the glass article at the end of each time step. New concentrations for the mobile ions in the bath can then be calculated and used in populating the sites of the interface layer for the next time step. To calculate the new concentrations in the bath, the dimensions of the bath, specifically, the volume of molten salt in the bath, needs to be inputted as one of the system parameters provided to the software.

The process for handling bath poisoning can be illustrated by considering the case of an ion-exchange process employing a bath which initially contains just K⁺ ions. By calculating updated molar concentrations for the K⁺ and Na⁺ ions in the bath, new K⁺ to Na⁺ ion ratios can be determined and used to set the contents of the sites of the interface layer for the next time step. For example, for 100 sites, if the molar ratio of K⁺ to Na⁺ changed from 100:0 initially to 99:1 after the first time step (or after a series of time steps), the next time step would have 99 sites occupied by K⁺ ions and 1 site occupied by a Na⁺ ion.

A further advantage of using an interface layer to represent the bath (or two interface layers in the case of thin glass articles) is that it allows for the elimination of one more modeling parameter, namely, $E_{vac\text{-}inter}$. Specifically, by assuming the bath is well-mixed and that the mixing occurs rapidly, vacancies need not be included in the interface layer and thus the need to obtain a value for $E_{vac\text{-}inter}$ is eliminated.

Thus, at this point, the number of modeling parameters has been reduced to six, i.e., $v_0$, $E_{Na\text{-}glass}$, $E_{K\text{-}glass}$, $E_{vac\text{-}glass}$, $E_{Na\text{-}inter}$, and $E_{K\text{-}inter}$. The next reduction which has been found to work in practice is to set $E_{Na\text{-}glass}=E_{K\text{-}glass}=E_{vac\text{-}glass}$ and $E_{Na\text{-}inter}=E_{K\text{-}inter}$, thus reducing the number of modeling parameters to three, i.e., $v_0$, $E_{glass}$, and $E_{inter}$. This reduction in modeling parameters can, for example, be justified because the diffusion of the K⁺ and Na⁺ ions is coupled. Finally, the number of modeling parameters can be reduced to just two by setting $E_{Na\text{-}glass}=E_{K\text{-}glass}=E_{vac\text{-}glass}=E_{Na\text{-}inter}=E_{K\text{-}inter}$. The two modeling parameters are then $v_0$ and E.

In practice, the use of just two modeling parameters has been found to produce concentration profiles having correct shapes but in some cases a concentration value at the surface of the glass article that is too large or too small. In such cases, the entire profile can be simply shifted by being multiplied by a scaling factor so as to correct the surface value. (Note that the scaling factor can be considered a modeling parameter.) Alternatively, the three modeling parameters $v_0$, $E_{glass}$, and $E_{inter}$ can be used when both the shape and magnitudes of the concentration profile are desired.

Thus, in summary, instead of twelve modeling parameters, only two modeling parameters have been found to be needed when only the shape of a concentration profile is of interest and only three parameters when both the shape and magnitude are desired. This major reduction in modeling parameters makes the technology of this disclosure much simpler to implement and use.

As noted above, in addition to the discretization parameters d and $N_s$, the time step $\Delta t$ also needs to established. A time step given by the following equation has been found to work successfully in practice, where $E_{min}$ is the smallest of the energy barrier parameters:

$$\Delta t = \frac{0.01}{v_0 e^{-E_{min}/kT}} \qquad \text{Eq. (4)}$$

The 0.01 in this equation is 1% of the time for one jump.

For the case where only one energy barrier modeling parameter is used, this becomes:

$$\Delta t = \frac{0.01}{v_0 e^{-E/kT}} \quad \text{Eq. (5)}$$

Once the system parameters, discretization parameters, and modeling parameters have been set, a calculation is performed in which a random value ($P_{rand}$) is generated with a uniform distribution between 0 and 1. As used herein, a random value is a value calculated using a pseudorandom number generator of the type available in a variety of commercial math packages, e.g., MATHEMATICA and MATLAB. This value is then compared with the jumping probability of each atom or vacancy as determined from Eq. (1). For the case of three modeling parameters (i.e., $v_0$, $E_{glass}$, and $E_{inter}$), Eq. (1) becomes the following two equations for ions in glass layers and interface layer(s), respectively:

$$P_{jump\text{-}glass} = 1 - (1 - e^{-E_{glass}/kT})^{v \Delta t} \quad \text{Eq. (6)}$$

$$P_{jump\text{-}inter} = 1 - (1 - e^{-E_{inter}/kT})^{v \Delta t} \quad \text{Eq. (7)}$$

where $v = v_0 e^{-E_{glass}/kT}$ in Eq. (6) and $v = v_0 e^{-E_{inter}/kT}$ in Eq. (7).

For the case of two modeling parameters (i.e., $v_0$ and E), Eq. (1) becomes:

$$P_{jump} = 1 - (1 - e^{-E/kT})^{v \Delta t} \quad \text{Eq. (8)}$$

where $v = v_0 e^{-E/kT}$.

If the random value is larger than the jumping probability, the mobile species stays in the same layer. If the random value is smaller than the jumping probability but larger than half of the jumping probability, the mobile species jumps backward; otherwise, the mobile species jumps forward. In the case of an interface layer for an ion-exchange process, one of the jumps, e.g., the forward jump, puts the mobile species in the bath.

This random value calculation is performed for all the mobile species and vacancies for each time step and then a count is made of the number of mobile species and vacancies in each layer, which gives the desired concentration profile(s) and diffusion kinetics through the end of the time step. The process is then repeated using the spatial distribution of the last time step as the starting distribution of the next time step, with the mobile species in the interface layer(s) being based on the bath concentrations at the end of the last time step. Because of the use of a random value (random variable) to determine the type of jumping a mobile species undergoes, analysis techniques of this type are sometimes referred to as Monte Carlo techniques. The use of the random variable means that the calculated concentration profiles as a function of time are, in general, not identical from run to run. However, in practice, it has been found that this variability can easily be accommodated by a simple average of a number of runs, e.g., 10 runs.

FIG. 1 summarizes the techniques described above for determining concentration profiles and diffusion kinetics during ion-diffusion processes, specifically, in the case shown, an ion-exchange process. As discussed above, for a heat treatment, the process is substantially the same except that the bath is no longer part of the system and the interface layer or layers prohibit outward jumping from the glass article. Among other things, FIG. 1 illustrates the use of system, discretization, and modeling parameters, the use of an interface layer to represent the molten salt bath, and the random variable technique for executing the jumps within and between layers of the glass article.

The mathematical procedures described above can be readily implemented using a variety of computer equipment and a variety of programming languages or mathematical computation packages such as MATHEMATICA (Wolfram Research, Champaign, Ill.), MATLAB (MathWorks of Natick, Mass.), or the like. Customized software can also be used. Output from the procedures can be in electronic and/or hard copy form, and can be displayed in a variety of formats, including in tabular and graphical form. For example, graphs of the types shown in the figures can be prepared using commercially available data presentation software such as MICROSOFT's EXCEL program or similar programs. Software embodiments of the procedures described herein can be stored and/or distributed in a variety of forms, e.g., on a hard drive, diskette, CD, flash drive, etc. The software can operate on various computing platforms, including personal computers, workstations, mainframes, etc.

The ion concentration profiles predicted/estimated in accordance with the present disclosure can be produced in glass articles using equipment now known or subsequently developed for performing heat treatments and ion-exchange treatments. Likewise, for ion-exchange treatments, bath solutions that are now known or subsequently developed can be used. Along the same lines, the glass articles can have a variety of compositions suitable for ion-diffusion processing now known or subsequently developed.

Without intending to limit it in any manner, the present disclosure will be further illustrated by the following examples. Among other things, the examples illustrate representative applications of the technology disclosed herein to the calculation of ion profiles and kinetics during ion-exchange processes.

It should, of course, be understood that these particular examples are not limiting and the technology disclosed herein can be employed in a variety of ways to understand and/or to improve chemical strengthening of glass articles. Also, the technology can be used to discover new protocols for chemical strengthening that meet desired mechanical criteria. For example, the concentration profiles can be used to calculate various mechanical properties, including failure properties, of glass articles that have been chemically strengthened using, for example, analysis techniques of the type disclosed in V. M. Sglavo, L. Larentis, and D. J. Green, Flaw-insensitive ion-exchanged glass: I, theoretical aspects, J. Am. Ceram. Soc., 84, 1827 (2001).

The calculations discussed below and illustrated in FIGS. 2-10 used two modeling parameters, i.e., $v_0$ and E. A scaling factor was also used when quantitative values are shown. The calculations were performed for Code 2318 glass, commercially available from Corning, Incorporated (see for example, www.corning.com; see also U.S. Patent Application Publication No. 2011/0045961). As used in the analysis, it was assumed that Code 2318 glass had the following nominal composition in mole %: $SiO_2$ 69.49; $Al_2O_3$ 8.45; $Na_2O$ 14.01; $K_2O$ 1.16; $SnO_2$ 0.185; MgO 6.2; CaO 0.507; $ZrO_2$ 0.01; $Fe_2O_3$ 0.008. More generally, Code 2318 glass can have a composition within the following ranges: 61 mol %≤$SiO_2$≤75 mol %; 7 mol %≤$Al_2O_3$≤15 mol %; 0 mol %≤$B_2O_3$≤12 mol %; 9 mol %≤$Na_2O$≤21 mol %; 0 mol %≤$K_2O$≤4 mol %; 0 mol %≤MgO≤7 mol %; and 0 mol %≤CaO≤3 mol %.

EXAMPLE 1

Figure 4:
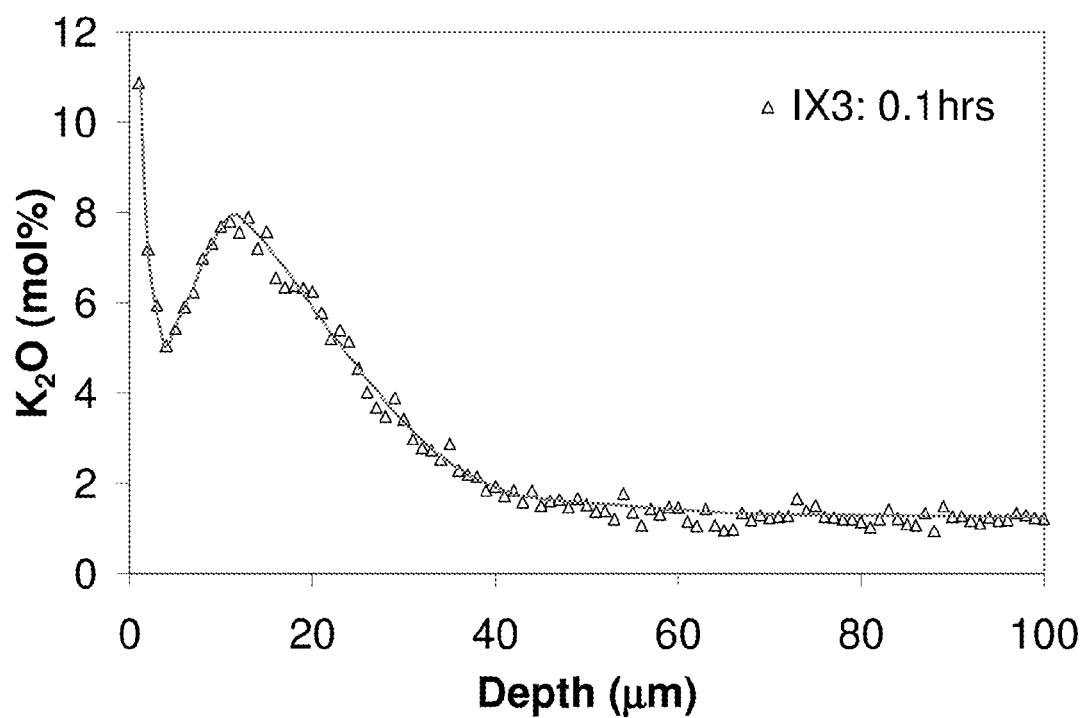
FIG. 4 is a plot of a concentration profile for $K_2O$ calculated in accordance with an embodiment of the disclosure for a triple ion-exchange process (TIOX).
Figure 5:
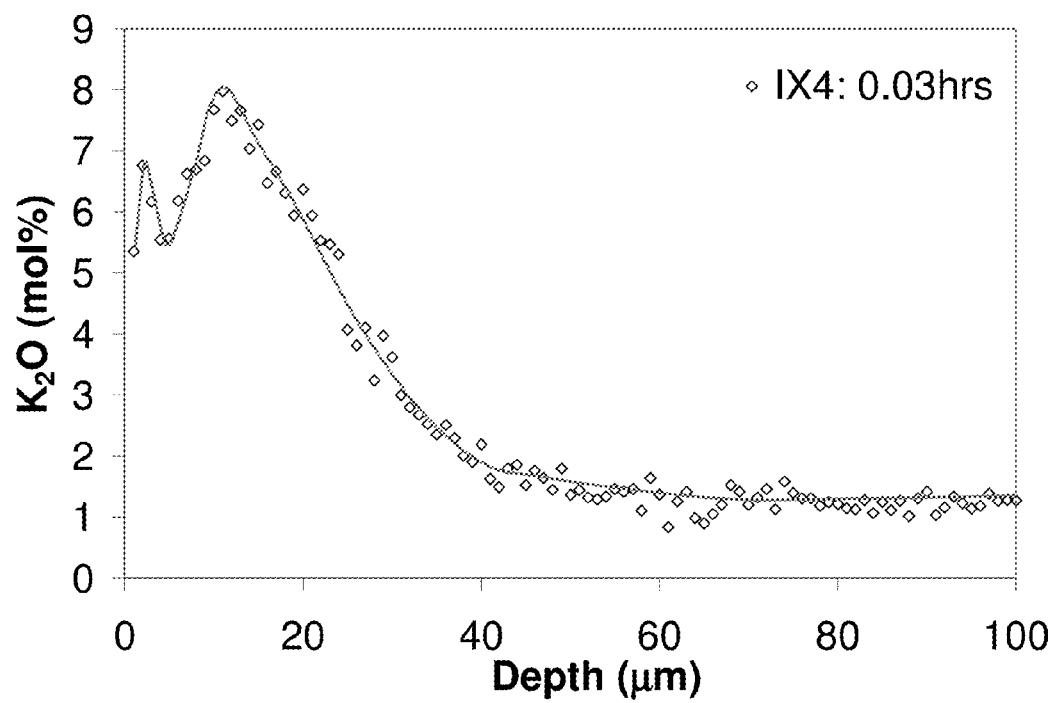
FIG. 5 is a plot of a concentration profile for $K_2O$ calculated in accordance with an embodiment of the disclosure for a quadruple ion-exchange process (QIOX).

This example illustrates the use of the techniques disclosed herein to calculate concentration profiles produced by multi-step ion-exchange (IOX) process (1 to 4 steps) in Code 2318 glass, including an error-function type concentration profile produced by a single IOX process (FIG. 2), a buried K⁺ peak concentration profiled produced by a double IOX process (FIG. 3), a buried peak with a high K⁺ concentration retained on surface produced by a triple IOX process (FIG. 4), and double buried peaks produced by a quadruple IOX process (FIG. 5).

Figure 2:
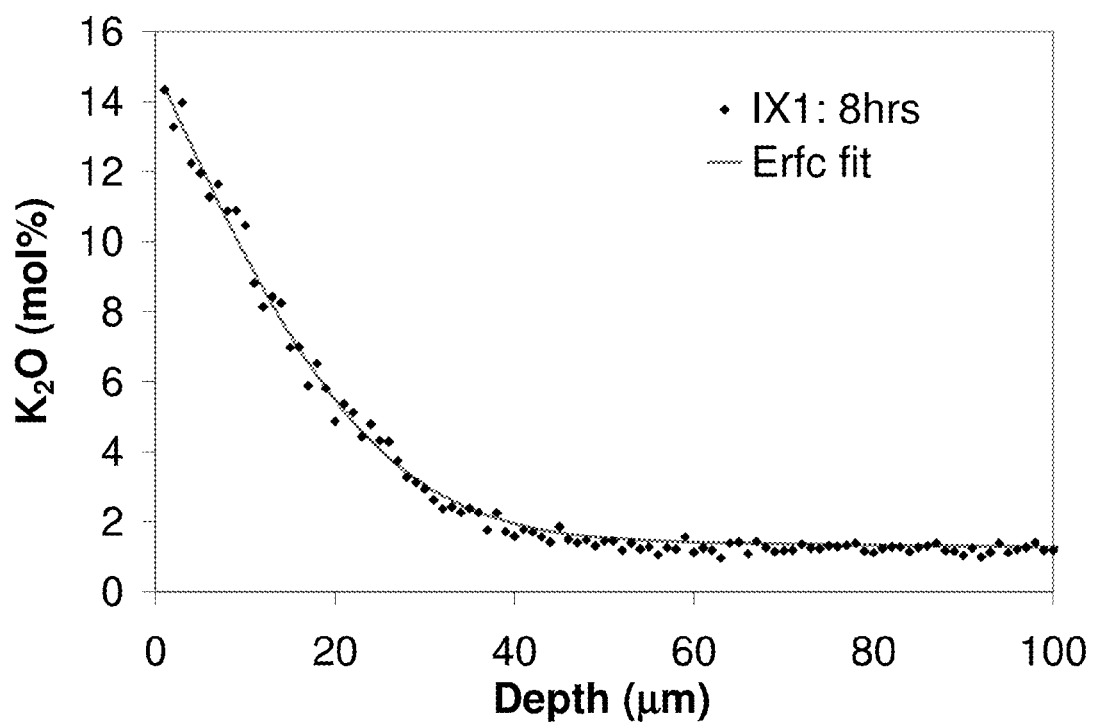
FIG. 2 is a plot of a concentration profile for $K_2O$ calculated in accordance with an embodiment of the disclosure for a single ion-exchange process (SIOX).
Figure 3:
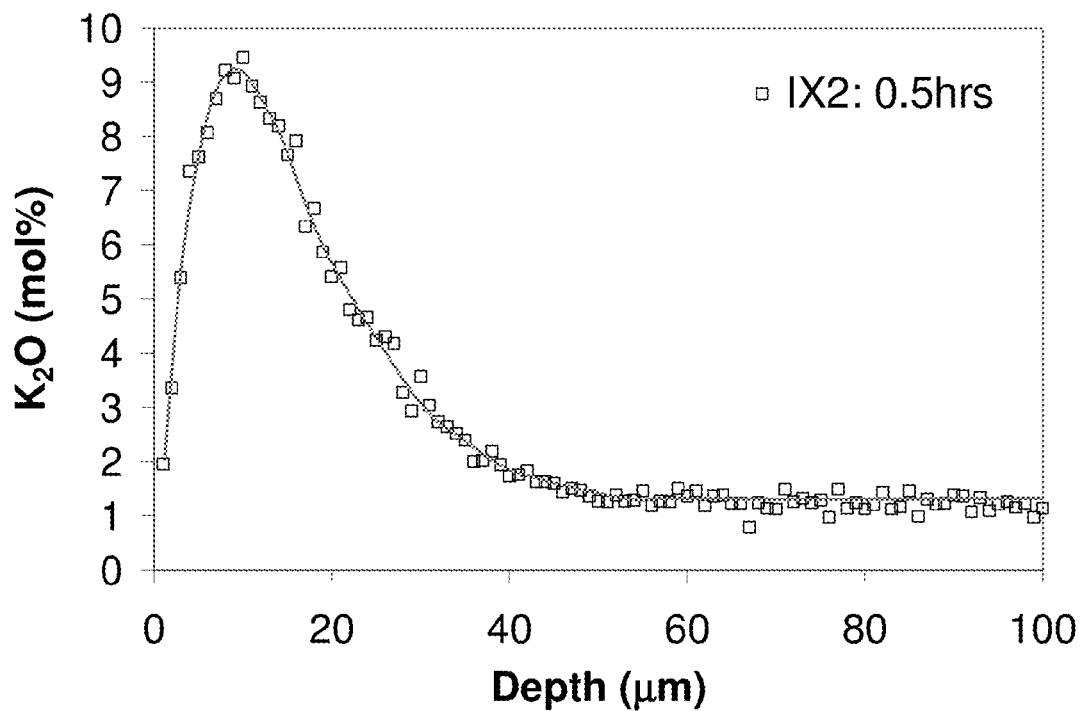
FIG. 3 is a plot of a concentration profile for $K_2O$ calculated in accordance with an embodiment of the disclosure for a double ion-exchange process (DIOX).

The ion exchange conditions used to obtain the four profiles were as follows:

FIG. 2: 100% $KNO_3$/410° C./8 h;

FIG. 3: (1) 100% $KNO_3$/410° C./8 h, (2) 100% $NaNO_3$/410° C./0.5 h;

FIG. 4: (1) 100% $KNO_3$/410° C./8 h, (2) 100% $NaNO_3$/410° C./4 h, (3) 100% $KNO_3$/410° C./0.1 h;

FIG. 5: (1) 100% $KNO_3$/410° C./8 h, (2) 100% $NaNO_3$/410° C./4 h, (3) 100% $KNO_3$/410° C./0.1 h, (4) 100% $NaNO_3$/410° C./0.03 h.

The calculated concentration profile for the single IOX process was in agreement with the following analytical expression for a single ion-exchange process obtained by solving the diffusion equation:

$$C(z, t) = (C_{surf} - C_{base})Erfc\left(\frac{z}{2\sqrt{Dt}}\right) + C_{base} \quad \text{Eq. (9)}$$

where D is the mutual diffusivity.

A mutual diffusivity of ~6.05*10⁻³ μm²/s at 410° C. was extracted by fitting the simulated concentration profile of FIG. 2 to Eq. (9). Alternatively, the mutual diffusivity can be also extracted from the time dependence of the depth of layer (DOL). In agreement with the analytical expression, the calculated result obtained using the techniques disclosed herein also showed that the DOL is linearly proportional to the square root of IOX time, i.e. $t^{0.5}$. Defining the concentration DOL as the depth where C(z=DOL)=$C_{base}$, and using Eq. (9) gives a DOL≈3.646√Dt. From the slope of a fitted straight line to a plot of DOL vs. $t^{0.5}$, a mutual diffusivity of ~4.57*10⁻³ μm²/s was obtained. The difference between the mutual diffusivity values obtained using these two fitting approaches is not considered significant.

EXAMPLE 2

This example illustrates the use of the techniques disclosed herein to investigate the diffusion kinetics of mobile ions, specifically the time evolution of concentration profiles and the amount of alkali ions in glass articles undergoing single and double IOX processes.

Figure 6:
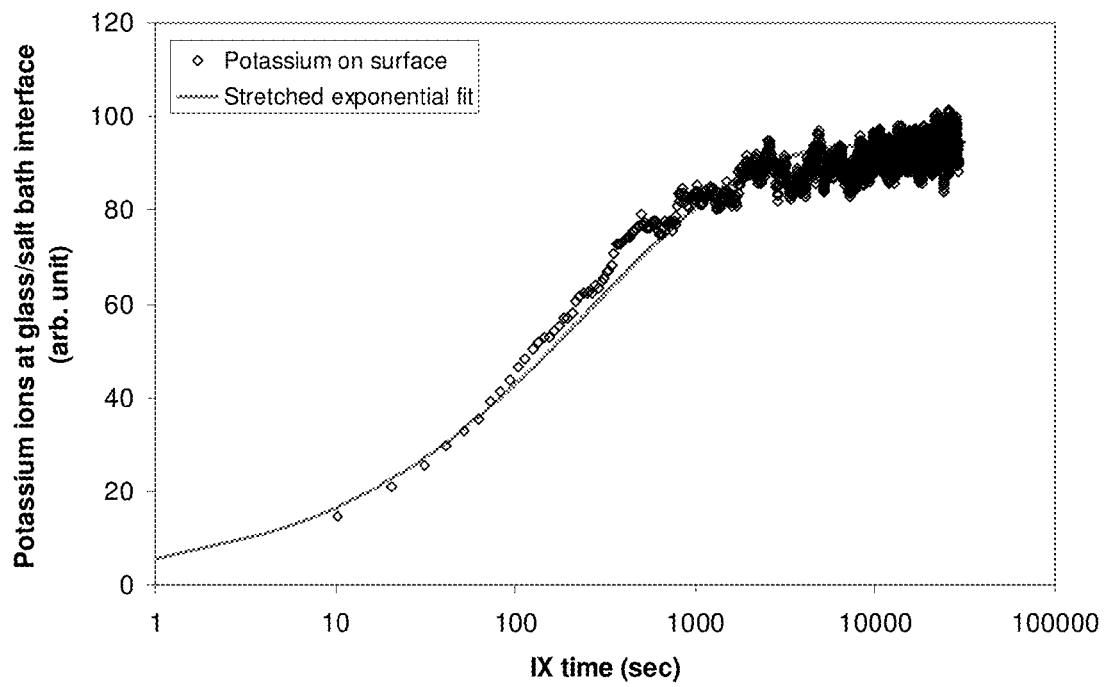
FIG. 6 is a plot of potassium ion concentration at a glass/salt bath interface (glass surface) as a function of ion-exchange time (IX time) in a one-step ion exchange process. The potassium ion concentrations shown by the data points were calculated in accordance with an embodiment of the disclosure.

FIG. 6 gives an example of the time dependence of the amount of alkali ions at the interface with a salt bath in a one-step ion exchange process. The ion concentration at the surface can be modeled by a single stretched exponential expression:

$$C_{surf}(t) = A\left[1 - \exp\left(-\left(\frac{t}{\tau}\right)^\beta\right)\right] \quad \text{Eq. (10)}$$

Fitting to the computed data points of FIG. 6 gives A, β, and τ values of 94.3, 0.5, and 272, respectively. The solid curve in FIG. 6 is a plot of Eq. (10) for these values.

More important than their ability to predict/estimate the effects of a single IOX process, the techniques disclosed herein are also able to predict/estimate the diffusion kinetics of ions in multi-step IOX process, as well as combinations of one or more IOX processes and one more heat treatment processes, e.g., a post-IOX heat treatment process following one or more IOX processes.

As an example, FIGS. 7-10 illustrate the kinetics of a double IOX process in terms of the time evolution of the depth of layer, alkali concentrations, and buried peak depth. For each of these figures, the ion exchange conditions were: (1) 100% $KNO_3$/410° C./8 h; (2) 100% $NaNO_3$/410° C.

Figure 7:
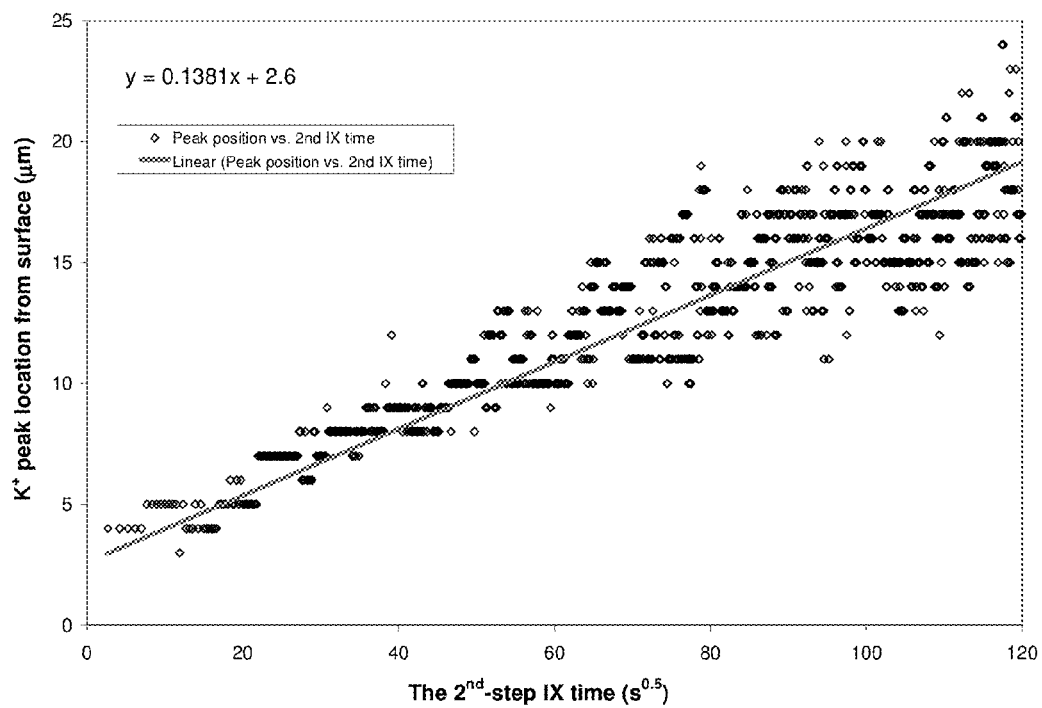
FIG. 7 is a plot of potassium concentration peak location as a function of $2^{nd}$ ion exchange time (2nd step IX time) in a double ion-exchange process. The 2nd step time is plotted in terms of the square root of the bath time. The peak locations shown by the data points were calculated in accordance with an embodiment of the disclosure.

As shown in FIG. 7, the peak depth of K⁺ is linearly proportional to the square root of 2$^{nd}$ IOX time, i.e.

$$d_{peak} \propto \sqrt{t_{DIOX}}.$$

With the IOX conditions used in FIG. 7, it took about 1 hour for the buried peak to shift to ~11 μm beneath the surface. Simulation with various concentrations and temperatures for the 2$^{nd}$ bath showed that the peak depth moves faster as the Na:K ratio and temperature of the 2$^{nd}$ bath increases. It should be noted that the scatter at larger depths (longer 2$^{nd}$ IOX times) shown in FIG. 7 arises because the buried peak is relatively flat (broad) and thus finding its maximum is numerically challenging.

Figure 8:
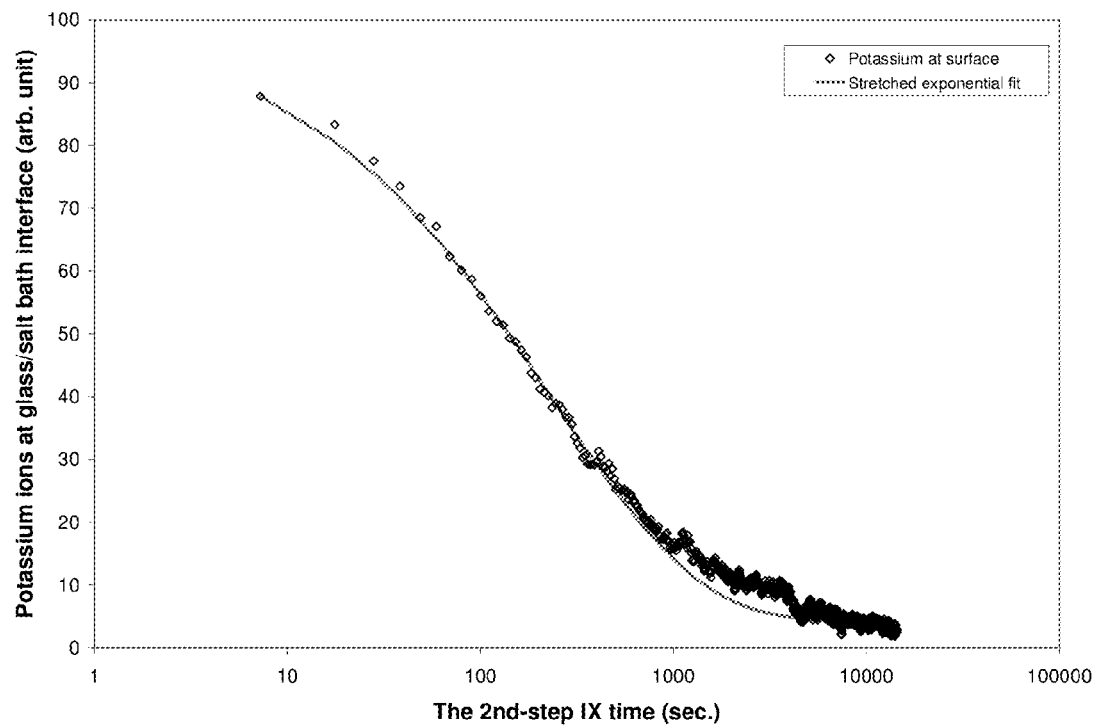
FIG. 8 is a plot of potassium ion concentration at a glass/salt bath interface (glass surface) as a function of $2^{nd}$ ion exchange time (2nd step IX time) in a double ion-exchange process. The potassium ion concentrations shown by the data points were calculated in accordance with an embodiment of the disclosure.
Figure 9:
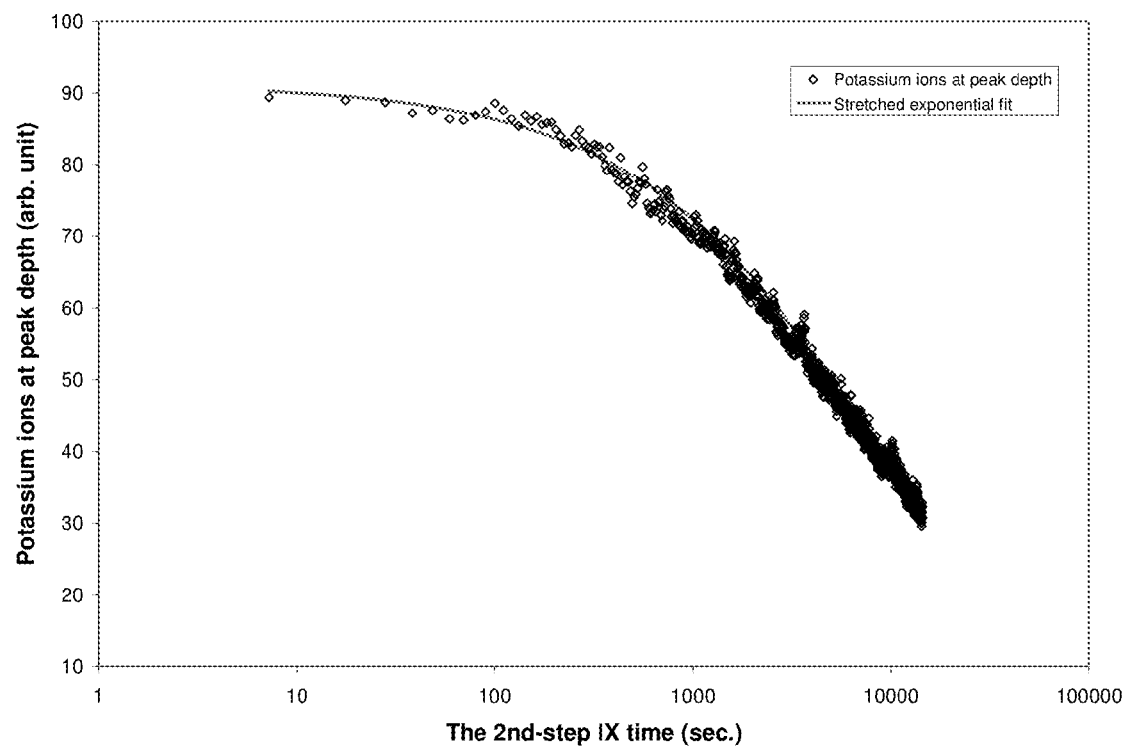
FIG. 9 is a plot of potassium ion concentration at the potassium ion peak location (peak depth) as a function of $2^{nd}$ ion exchange time (2nd step IX time) in a double ion-exchange process. The peak concentrations shown by the data points were calculated in accordance with an embodiment of the disclosure.

As shown in FIGS. 8 and 9, both the 2$^{nd}$ step IOX time dependence of the K⁺ concentration at the interface with the bath (the surface of the glass article) and the peak depth follow the form of a stretched exponential function:

$$C_{surf/peak}(t) = A\exp\left(-\left(\frac{t}{\tau}\right)^\beta\right) + B \quad \text{Eq. (11)}$$

A, β, τ, and B values for the data of FIGS. 8 and 9 are: 95.8, 0.57, 238, and 4.2 for FIGS. 8 and 82.4, 0.62, 8862, and 8.9 for FIG. 9. The solid lines in FIGS. 8 and 9 are plots of Eq. (11) using these values. From these values, it can be seen that both the K⁺ concentration at the interface and the peak depth decrease with time in the 2$^{nd}$ step IOX process, with the latter decreasing much slower.

Figure 10:
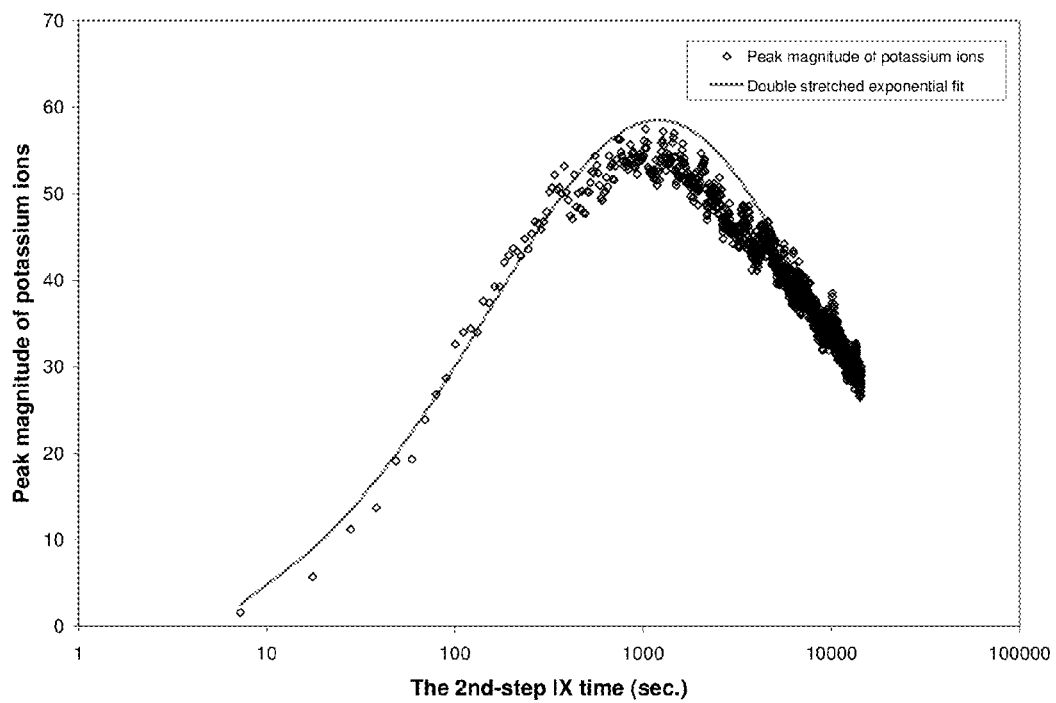
FIG. 10 is a plot of potassium ion concentration peak magnitude as a function of $2^{nd}$ ion exchange time (2nd step IX time) in a double ion-exchange process. The peak magnitudes shown by the data points were calculated in accordance with an embodiment of the disclosure.

The 2$^{nd}$ step IOX time dependence of the peak magnitude of the K⁺ concentration, defined as the difference between the K⁺ concentration at the interface and at the peak depth, is shown in FIG. 10. This curve has the following form:

$$C_{mag}(t) = A_1\exp\left(-\left(\frac{t}{\tau_1}\right)^{\beta_1}\right) - A_2\exp\left(-\left(\frac{t}{\tau_2}\right)^{\beta_2}\right) + B \quad \text{Eq. (12)}$$

A fit of Eq. (12) to the data of FIG. 10 gave $A_1$, $\beta_1$, $\tau_1$, $A_1$, $\beta_1$, $\tau_1$, and B values of 82.4, 0.62, 8862, 95.8, 0.57, 238, and 4.7, respectively. As can be seen in FIG. 10, the peak magnitude reaches a maximum about 20 minutes into the 2$^{nd}$ IOX. Insights such as this can greatly facilitate the design of ion-diffusion treatments of glass articles.

Although not illustrated by the above examples, the techniques disclosed herein can also be used to account for salt bath poisoning, bath size, and arbitrary temperature paths. For example, for salt bath poisoning, a user can input an initial bath poisoning ratio (Na/(Na+K)) and then given the glass sheet size and bath size, the software can update the salt bath poisoning after performing one iteration of calculation for the ions' and vacancies' random walk, and thus provide the user with a salt bath poisoning rate. Likewise, a variety of temperature paths for an IOX process or a heating process can be employed, e.g., a fixed temperature profile, a linear time-dependent temperature profile, a zigzag temperature profile, or an exponential time-dependent temperature profile, e.g., a profile described by an equation of the form:

$$T=T_0-(T_f-T_0)*(1-e^{-t/\tau}), \quad \text{Eq. (13)}$$

where $T_0$ and $T_f$ are the initial and final temperatures, respectively, and $\tau$ is the decay constant. An arbitrary temperature-time profile can also be used if desired.

As illustrated by the above examples, the computer-implemented prediction/estimation process disclosed herein allow a user to simulate multi-step IOX processes and post-IOX heat treatments involving salt bath and temperature switching in a user-friendly manner. For an example of a 4-step IOX process, the user merely needs to input the salt bath, IOX temperature and time periods for the $1^{st}$, $2^{nd}$, $3^{rd}$ and $4^{th}$ IOX steps, and the program can calculate and display the time evolution of the ion profiles. To account for a post-IOX heat treatment, the program is simply set with no alkali ion exchange at the interface of the glass and the salt bath.

In order to obtain a tailor-designed IOX profile, one needs to know precisely the time and temperature dependences of various characteristics of the profile, e.g. the depth of the IOX layer and the surface alkali concentration. For a profile with a buried peak, the time evolution and the temperature dependence of the depth and magnitude of the peak are generally needed. All this information, as well as the underlying diffusion kinetics, can be extracted from the time-dependent IOX concentration profiles calculated by the program, thus enabling the precise design of IOX profiles.

From the foregoing, it can be seen that various embodiments of the present disclosure provide some or all of the following advantages:

Significant cost and time savings compared to a purely brute-force experimental approach.

Reduced user-input effort compared to analytical methods which require solving complex diffusion equations with various boundary conditions.

Procedures that require only minimal calibration of modeling parameters from a limited number of ion exchange experiments to perform accurate calculation of concentration profiles and kinetics.

A robust technique able to account for arbitrary bath size, bath contamination, arbitrary temperature path, IOX time, multi-step IOX processes, and post-IOX heat treatments.

The ability to combine kinetic calculations with mechanical modeling in order to improve mechanical properties of chemically-strengthened glass articles, e.g., to improve the stress profiles within such articles.

Computer-generated plots that enable the study of diffusion kinetics for multi-step IOX processes and post-IOX heat treatments.

Diffusion kinetics especially for multi-step IOX processes and post-IOX heat treatments for use in designing controlled ion-diffusion processes.

A variety of modifications that do not depart from the scope and spirit of the claimed subject matter will be evident to persons of ordinary skill in the art from the foregoing disclosure. The following claims are intended to cover the specific embodiments set forth herein as well as modifications, variations, and equivalents of those embodiments.

What is claimed is:

1. A method of chemically strengthening a glass article which comprises at least one mobile ion, the method comprising subjecting the glass article to one or more ion-diffusion processes in each of which the glass article is subject to a predetermined temperature versus time profile, wherein at least one profile is at least partially based on a computer-implemented model for the spatial distribution as a function of time of the at least one mobile ion within the glass article, said computer-implemented model comprising moving mobile ions within the glass article based on a random value, wherein the computer-implemented model discretizes at least part of the glass article into a plurality of layers internal to the glass article and at least one interface layer at an edge of the glass article; and wherein
   the interface layer controls movement of the at least one mobile ion between the glass article and the molten salt bath.

2. The method of claim 1 wherein:
   (i) the one or more ion-diffusion processes comprises at least one ion-exchange process; and
   (ii) the at least one ion-exchange process comprises immersing at least part of the glass article in a molten salt bath.

3. The method of claim 1 wherein:
   (i) the one or more ion-diffusion processes comprises at least one ion-exchange process;
   (ii) the at least one ion-exchange process comprises immersing at least part of the glass article in a molten salt bath; and
   (iii) the computer-implemented model models poisoning of the molten salt bath during the ion-exchange process.

4. The method of claim 3 wherein:
   (i) the computer-implemented model discretizes at least part of the glass article into a plurality of layers internal to the glass article and at least one interface layer at an edge of the glass article; and
   (ii) the computer-implemented model models poisoning of the molten salt bath by populating the interface layer with mobile ions based on the composition of the bath.

5. The method of claim 1 wherein:
   (i) the one or more ion-diffusion processes comprises at least one heat treatment process; and
   (ii) the computer-implemented model prohibits the at least one mobile ion from leaving the glass article during the heat treatment process.

6. The method of claim 1 wherein the one or more ion-diffusion processes comprises at least one ion-exchange process followed by a heat treatment process.

7. The method of claim 1 wherein the computer-implemented model employs only two modeling parameters whose values are determined by fitting to experimental data obtained for the glass making up the glass article.

8. The method of claim 7 wherein:
   (i) the computer-implemented model moves mobile ions within the glass article by jumping; and
   (ii) the two modeling parameters are an energy-barrier-for-jumping parameter and a jumping frequency parameter.

9. The method of claim 1 wherein the computer-implemented model employs only three modeling parameters whose values are determined by fitting to experimental data obtained for the glass making up the glass article.

10. The method of claim 9 wherein:
   (i) the computer-implemented model discretizes at least part of the glass article into a plurality of layers internal to the glass article and at least one interface layer at an edge of the glass article;
   (ii) the computer-implemented model moves mobile ions within the glass article by jumping between or within layers; and
   (iii) the three modeling parameters are an energy-barrier-for-jumping parameter for layers internal to the glass article, an energy-barrier-for-jumping parameter for the at least one interface layer, and a jumping frequency parameter.

11. The method of claim 9 wherein:
(i) the computer-implemented model moves mobile ions within the glass article by jumping; and
(ii) the three modeling parameters are an energy-barrier-for-jumping parameter, a jumping frequency parameter, and a scaling factor.

* * * * *